United States Patent
Crandall et al.

(10) Patent No.: US 9,577,626 B2
(45) Date of Patent: Feb. 21, 2017

(54) APPARATUS AND METHODS FOR CONTROLLING RADIO FREQUENCY SWITCHES

(71) Applicant: Skyworks Solutions, Inc., Woburn, MA (US)

(72) Inventors: Jonathan Christian Crandall, Marion, IA (US); Kenneth Norman Warren, Anamosa, IA (US); Philip H. Thompson, Cedar Rapids, IA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/745,818

(22) Filed: Jun. 22, 2015

(65) Prior Publication Data

US 2016/0043710 A1 Feb. 11, 2016

Related U.S. Application Data

(60) Provisional application No. 62/034,682, filed on Aug. 7, 2014.

(51) Int. Cl.
| | | |
|---|---|---|
| *H03K 17/04* | (2006.01) | |
| *H03K 17/0412* | (2006.01) | |
| *H03K 17/693* | (2006.01) | |

(52) U.S. Cl.
CPC ........ *H03K 17/04* (2013.01); *H03K 17/04123* (2013.01); *H03K 17/693* (2013.01)

(58) Field of Classification Search
CPC H03K 17/04; H03K 17/0403; H03K 17/0406; H03K 17/041

(Continued)

(56) References Cited

U.S. PATENT DOCUMENTS

| 5,883,501 A | 3/1999 | Arakawa | |
|---|---|---|---|
| 8,008,970 B1 * | 8/2011 | Homol | H03F 3/72 |
| | | | 330/296 |

(Continued)

OTHER PUBLICATIONS

Micrel, Inc., "MIC 4833: Low Noise Dual 220 $V_{pp}$ EL Driver With Output Voltage Slew Rate Control," Oct. 2008, 12 pages. Available at: www.micrel.com/_PDF/mic4833.pdf (accessed Jul. 21, 2015).

(Continued)

*Primary Examiner* — Lincoln Donovan
*Assistant Examiner* — Metasebia Retebo
(74) *Attorney, Agent, or Firm* — Knobbe Martens Olson & Bear LLP

(57) ABSTRACT

Apparatus and methods for controlling radio frequency (RF) switches are disclosed. Provided herein are apparatus and methods for controlling RF switches. In certain configurations, an RF system includes a charge pump for generating a charge pump voltage, an RF switch, a level shifter for turning on or off the RF switch, and a level shifter control circuit for controlling the level shifter. The charge pump receives a mode signal used to enable or disable the charge pump. Additionally, the level shifter receives power in part from the charge pump voltage, and controls the RF switch based on a switch enable signal. The level shifter control circuit receives the mode signal and biases the level shifter with a bias voltage that changes based on a state of the mode signal.

20 Claims, 9 Drawing Sheets

(58) Field of Classification Search
USPC .................................................. 327/374–377
See application file for complete search history.

(56) References Cited

U.S. PATENT DOCUMENTS

| | | | |
|---|---|---|---|
| 8,131,225 | B2 | 3/2012 | Botula et al. |
| 8,583,111 | B2 | 11/2013 | Burgener et al. |
| 9,245,596 | B1 * | 1/2016 | Yang ..................... G11C 16/30 |
| 2001/0030574 | A1 | 10/2001 | Takai |
| 2006/0044930 | A1 | 3/2006 | Jung |
| 2007/0290744 | A1 | 12/2007 | Adachi et al. |
| 2010/0148840 | A1 | 6/2010 | Weng et al. |
| 2012/0049938 | A1 | 3/2012 | Ishimori et al. |
| 2012/0112834 | A1 | 5/2012 | Van Bezooijen |
| 2013/0009725 | A1 | 1/2013 | Heaney et al. |
| 2013/0029614 | A1 | 1/2013 | Cho et al. |
| 2013/0052968 | A1 | 2/2013 | Popplewell et al. |
| 2013/0052969 | A1 | 2/2013 | Seshita |
| 2013/0328597 | A1 | 12/2013 | Cassia |
| 2014/0321008 | A1 | 10/2014 | Keane et al. |
| 2016/0034217 | A1 * | 2/2016 | Kim ..................... G06F 3/0622 |
| | | | 711/103 |
| 2016/0036320 | A1 | 2/2016 | Crandall et al. |

OTHER PUBLICATIONS

Saxena, Vishal, "Charge Pump Design," ECE, Boise State University, Nov. 2, 2010, 64 pages. Available at: http://www.lumerink.com/courses/ece5410/Handouts/Charge_Pump_Design.pdf (accessed Jul. 21, 2015).
International Search Report and Written Opinion of the International Searching Authority, issued on Nov. 19, 2015 in connection with PCT Application No. PCT/US2015/044374.

* cited by examiner

APPARATUS AND METHODS FOR CONTROLLING RADIO FREQUENCY SWITCHES

CROSS-REFERENCE TO RELATED APPLICATIONS

This application claims the benefit of priority under 35 U.S.C. §119(e) of U.S. Provisional Patent Application No. 62/034,682, filed Aug. 7, 2014 and titled "APPARATUS AND METHODS FOR CONTROLLING RADIO FREQUENCY SWITCHES," which is herein incorporated by reference in its entirety.

BACKGROUND

Field

Embodiments of the invention relate to electronic systems, and in particular, to switch controllers for radio frequency switches.

Description of the Related Technology

Radio frequency (RF) switches can be included in a variety of electronic systems.

In one example, an RF system can include an antenna for receiving and/or transmitting RF signals. However, there can be several components in the RF system that may need to access to the antenna. For example, the RF system can include different transmit or receive paths associated with different frequency bands, different communication standards and/or different power modes, and each path may need access to the antenna at certain instances of time. Accordingly, the RF system can include RF switches that can be used to electrically connect the antenna to a particular transmit or receive path of the RF system, thereby allowing multiple components to access the antenna.

The performance of RF switches can be important, since the RF switches can introduce noise and/or insertion loss.

SUMMARY

In certain embodiments, the present disclosure relates to a radio frequency (RF) system. The RF system includes a charge pump configured to generate a charge pump voltage, a first RF switch, a first level shifter configured to control the first RF switch based on a first switch enable signal, and a level shifter control circuit. The charge pump is configured to receive a mode signal that is operable to enable the charge pump in a first state and to disable the charge pump in a second state. The first level shifter is configured to receive power in part from the charge pump voltage. The level shifter control circuit is configured to receive the mode signal and to bias the first level shifter with a bias voltage. The level shifter control circuit is further configured to control a voltage level of the bias voltage based on a state of the mode signal.

In some embodiments, the level shifter control circuit is further configured to control the voltage level of the bias voltage to track the charge pump voltage when the mode signal is in the first state. In a number of embodiments, the level shifter control circuit is further configured to control the voltage level of the bias voltage to a DC voltage when the mode signal is in the second state.

In several embodiments, the level shifter includes a plurality of n-type metal oxide semiconductor (NMOS) cascode transistors including gates that are biased by the bias voltage. Accordingly to a number of embodiments, the level shifter further includes a plurality of p-type metal oxide semiconductor (PMOS) cascode transistors including gates that are biased by a power low supply voltage, a first PMOS cascode transistor of the plurality of PMOS cascode transistors and a first NMOS cascode transistor of the plurality of NMOS cascode transistors electrically connected in series between a power high supply voltage and the charge pump voltage.

According to various embodiments, the level shifter control circuit includes a cascode reference circuit configured to generate a cascode reference voltage that changes in relation to the charge pump voltage, the level shifter control circuit configured to control a voltage level of the bias voltage to the cascode reference voltage when the mode signal is in the first state.

In some embodiments, the level shifter control circuit includes an NMOS transistor and a PMOS transistor that operate in parallel to electrically connect the cascode reference voltage to the bias voltage when the mode signal is in the first state. In accordance with various embodiments, the cascode reference circuit includes a voltage divider electrically connected between a power high supply voltage and the charge pump voltage, the voltage divider configured to generate the cascode reference voltage. According to certain embodiments, the voltage divider includes a plurality of diode connected transistors electrically connected in series.

In several embodiments, the level shifter control circuit includes a standby control circuit configured to control a voltage level of the charge pump voltage to a power low supply voltage when the mode signal is in the second state. According to a number of embodiments, the standby control circuit is further configured to control a voltage level of the first switch control signal to the power low supply voltage when the mode signal is in the second state.

In some embodiments, the RF system further includes a second RF switch and a second level shifter configured to control the second RF switch based on a second switch enable signal, the level shifter control circuit further configured to bias the second level shifter with the bias voltage.

In certain embodiments, the present disclosure relates to a method of radio frequency switch control. The method includes generating a charge pump voltage using a charge pump, enabling the charge pump when a mode signal is in a first state and disabling the charge pump when the mode signal is in a second state, powering a first level shifter in part using the charge pump voltage, controlling a first RF switch based on level shifting a first switch enable signal using a first level shifter, biasing the first level shifter with a bias voltage, and controlling a voltage level of the bias voltage based on a state of the mode signal.

In some embodiments, controlling the voltage level of the bias voltage based on the state of the mode signal includes controlling the voltage level of the bias voltage to track the charge pump voltage when the mode signal is in the first state. According to a number of embodiments, the method further controlling the voltage level of the bias voltage based on the state of the mode signal further includes controlling the voltage level of the bias voltage to a DC voltage when the mode signal is in the second state.

In various embodiments, biasing the level shifter using the bias voltage includes biasing a plurality of transistor gates of the level shifter using the bias voltage.

In several embodiments, the method further includes controlling a voltage level of the charge pump voltage to a power low supply voltage when the mode signal is in the second state.

In some embodiments, the method further includes powering a second level shifter in part using the charge pump voltage, controlling a second RF switch based on level shifting a second switch enable signal using a second level shifter, and biasing the second level shifter with the bias voltage.

In certain embodiments, the present disclosure relates to a power amplifier system. The power amplifier system includes a charge pump configured to generate a charge pump voltage, a power amplifier configured to generate an amplified radio frequency signal, an antenna, an RF switch electrically connected between an output of the power amplifier and the antenna, and a switch controller including a level shifter configured to control the RF switch based on a switch enable signal. The charge pump is further configured to receive a mode signal operable to enable the charge pump in a first state and to disable the charge pump in a second state. The level shifter is further configured to receive power in part from the charge pump voltage. The switch controller further includes a level shifter control circuit configured to receive the mode signal and to bias the level shifter with a bias voltage. The level shifter control circuit is further configured to control a voltage level of the bias voltage based on a state of the mode signal.

In several embodiments, the level shifter control circuit is further configured to control the voltage level of the bias voltage to track the charge pump voltage when the mode signal is in the first state.

In certain embodiments, the present disclosure relates to an RF switching system. The RF switching system includes a first RF switch configured to turn on or off based on a first switch control signal, a level shifter control circuit configured to receive a mode signal and to generate a bias voltage, and a level shifter powered by a power high supply voltage and a charge pump voltage. The level shifter control circuit is configured to control a voltage level of the bias voltage based on a state of the mode signal. The level shifter is powered by a power high supply voltage and a charge pump voltage, and the level shifter is configured to receive a switch enable signal and the bias voltage. The level shifter is configured to level shift the switch enable signal to generate the first switch control signal when the mode signal is in the first state.

In some embodiments, the level shifter control circuit controls the voltage level of the bias voltage to track the charge pump voltage when the mode signal is in the first state. In a number of embodiments, the level shifter control circuit controls the voltage level of the bias voltage to the power high supply voltage when the mode signal is in the second state.

In various embodiments, the level shifter includes a plurality of NMOS cascode transistors including gates that are biased by the bias voltage. According to a number of embodiments, the level shifter further includes a plurality of PMOS cascode transistors including gates that are biased by a power low supply voltage, and a first PMOS cascode transistor of the plurality of PMOS cascode transistors and a first NMOS cascode transistor of the plurality of NMOS cascode transistors electrically connected in series between the power high supply voltage and the charge pump voltage.

In several embodiments, the level shifter control circuit includes a cascode reference circuit configured to generate a cascode reference voltage that changes in relation to the charge pump voltage, the level shifter control circuit configured to control a voltage level of the bias voltage to the cascode reference voltage when the mode signal is in the first state.

In various embodiments, the level shifter control circuit includes an NMOS transistor and a PMOS transistor that operate in parallel to electrically connect the cascode reference voltage to the bias voltage when the mode signal is in the first state.

In some embodiments, the cascode reference circuit includes a voltage divider electrically connected between the power high supply voltage and the charge pump voltage, the voltage divider configured to generate the cascode reference voltage. In accordance with a number of embodiments, the voltage divider includes a plurality of diode-connected transistors electrically connected in series.

In several embodiments, the RF switching system further includes a charge pump configured to generate the charge pump voltage, the charge pump configured to turn off when the mode signal is in the second state.

In various embodiments, the level shifter control circuit includes a standby control circuit configured to control a voltage level of the charge pump voltage to a power low supply voltage when the mode signal is in the second state. According to a number of embodiments, the standby control circuit is further configured to control a voltage level of the first switch control signal to the power low supply voltage when the mode signal is in the second state.

In some embodiments, the RF switching further includes a second RF switch that turns on or off based on a second switch control signal. The first RF switch is configured as a series switch and the second RF switch is configured as a shunt switch. The level shifter is further configured to level shift the switch enable signal to generate the second switch control signal when the mode signal is in the first state.

In certain embodiments, the present disclosure relates to a method of radio frequency switch control. The method includes generating a charge pump voltage using a charge pump, the charge pump voltage having a voltage level less than that of a power low supply voltage. The method further includes powering a level shifter using a power high supply voltage and the charge pump voltage, generating a bias voltage using a level shifter control circuit, controlling a voltage level of the bias voltage based on a state of a mode signal using the level shifter control circuit, biasing the level shifter using the bias voltage, level shifting a switch enable signal using the level shifter to generate a first switch control signal when the mode signal is in a first state, and controlling a first RF switch using the first switch control signal.

In some embodiments, controlling the voltage level of the bias voltage based on the state of the mode signal includes controlling the voltage level of the bias voltage to track the charge pump voltage when the mode signal is in the first state. In various embodiments, controlling the voltage level of the bias voltage based on the state of the mode signal further includes controlling the voltage level of the bias voltage to the power high supply voltage when the mode signal is in the second state.

In several embodiments, biasing the level shifter using the bias voltage includes biasing a plurality of gates of NMOS cascode transistors of the level shifter using the bias voltage. According to a number of embodiments, the method further includes generating a cascode reference voltage that changes in relation to the charge pump voltage, and controlling a voltage level of the bias voltage to the cascode reference voltage when the mode signal is in the first state.

In various embodiments, the method further includes turning off the charge pump when the mode signal is in the second state. In a number of embodiments, the method further includes electrically connecting the charge pump voltage to the power low supply voltage when the mode signal is in the first state. In some embodiments, the method further includes controlling a voltage level of the first switch control signal to the power low supply voltage when the mode signal is in the second state.

In certain embodiments, the present disclosure relates to a wireless device. The wireless device includes a power amplifier configured to generate an amplified radio frequency signal, an antenna, a first NMOS switch transistor electrically connected between an output of the power amplifier and the antenna, a gate of the first NMOS switch transistor configured to receive a first switch control signal, a charge pump configured to generate a charge pump voltage, a level shifter control circuit configured to receive a mode signal and to generate a bias voltage, the level shifter control circuit configured to control a voltage level of the bias voltage based on a state of the mode signal, and a level shifter powered by a power high supply voltage and the charge pump voltage. The level shifter is configured to receive a switch enable signal and the bias voltage, and the level shifter is configured to level shift the switch enable signal to generate the first switch control signal when the mode signal is in the first state.

In some embodiments, the level shifter control circuit controls the voltage level of the bias voltage to track the charge pump voltage when the mode signal is in the first state.

In various embodiments, the level shifter controls the voltage level of the bias voltage to the power high supply voltage when the mode signal is in the second state.

In several embodiments, the level shifter control circuit includes a standby control circuit configured to control a voltage level of the charge pump voltage to a power low supply voltage when the mode signal is in the first state. In a number of embodiments, the standby control circuit is further configured to control a voltage level of the first switch control signal to the power low supply voltage when the mode signal is in the second state.

In some embodiments, the wireless device further includes a second NMOS switch transistor switch transistor electrically connected between the output of the power amplifier and a power low supply voltage. A gate of the second NMOS switch transistor is configured to receive a second switch control signal, the level shifter further configured to level shift the switch enable signal to generate the second switch control signal when the mode signal is in the first state.

DETAILED DESCRIPTION OF EMBODIMENTS

Figure 1:
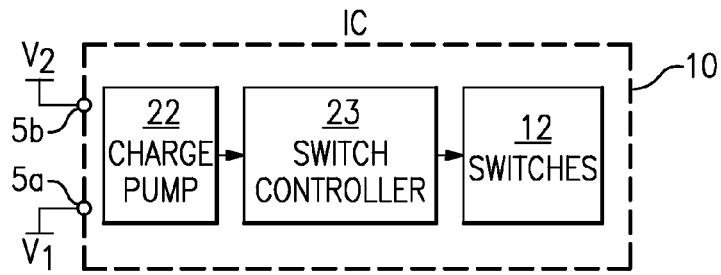
FIG. 1 is a schematic diagram of one embodiment of an integrated circuit (IC).

The headings provided herein, if any, are for convenience only and do not necessarily affect the scope or meaning of the claimed invention.

A radio frequency (RF) switching circuit can include a series switch between the RF switching circuit's input and output, and a shunt switch between the input and a power low supply voltage, such as ground. Additionally, the series switch and the shunt switch can be turned on or off in a complementary manner. When the series switch is turned on or closed and the shunt switch is turned off or opened, a low impedance path is provided from the RF switching circuit's input to output. Additionally, when the series switch is turned off and the shunt switch is turned on, the series switch operates with high impedance to block conduction between the input and output and the shunt switch operates with low impedance to provide input termination.

An RF switching circuit can be powered in part using a negative voltage generator, such as a charge pump. For instance, a charge pump can be used to generate a negative charge pump voltage for biasing the gate voltage of one or more n-type metal oxide semiconductor (NMOS) switch transistors when operating in an off state. Controlling the gate voltage of an NMOS switch transistor to a voltage below a power low supply voltage can increase off state impedance, which can enhance isolation and/or improve harmonic performance in multi-band applications.

In certain configurations, a negative voltage generator can be disabled or turned off in a standby mode. For example, a charge pump can operate using a clock signal generated by an oscillator that can dissipate quiescent current and/or generate noise. To prevent the charge pump from degrading system performance during standby, the charge pump can be disabled in the standby mode. Although disabling the charge pump during standby can decrease power consumption and/or noise, disabling the charge pump during standby can also undesirably cause the charge pump's output voltage to electrically float, thereby leaving the gate voltages of certain RF switches unpredictably controlled.

It can be desirable to control the gate voltages of RF switches even when operating in the standby mode. For example, controlling the gate voltages of the RF switches during standby can aid in maintaining isolation between various RF bands and/or circuits.

Provided herein are apparatus and methods for controlling RF switches. In certain configurations, an RF system includes a charge pump for generating a charge pump voltage, an RF switch, a level shifter for turning on or off the RF switch, and a level shifter control circuit for controlling the level shifter. The charge pump receives a mode signal used to enable or disable the charge pump. Additionally, the level shifter receives power in part from the charge pump voltage, and controls the RF switch based on a switch enable signal. The level shifter control circuit receives the mode signal and biases the level shifter with a bias voltage that changes based on a state of the mode signal.

The charge pump is enabled in a first state of the mode signal and disabled in a second state of the mode signal. For example, the first state can indicate a normal operating mode and the second state can indicate a standby mode. In certain configurations, the level shifter control circuit controls the voltage level of the bias voltage such that the bias voltage tracks the charge pump voltage when the mode signal is in the first state and such that the bias voltage has a substantially fixed or constant voltage when the mode signal is in the second state. Configuring the level shifter control circuit to generate the bias voltage in this manner can aid the level shifter in level shifting operations.

For example, in certain configurations, the level shifter is powered using a power high supply voltage and the charge pump voltage. Additionally, the level shifter includes a plurality of cascode transistors having gates that are biased by the bias voltage generated by the level shifter control circuit. When the mode signal is in a first state, the level shifter control circuit generates the bias voltage to have a voltage level that tracks the charge pump voltage to help the level shifter in level shifting the switch enable signal to a voltage domain associated with the power high supply voltage and the charge pump voltage. However, when the mode signal is in a second state, the level shifter control circuit controls the bias voltage to a fixed voltage. In certain implementations, the level shifter control circuit also controls the charge pump voltage to a power low supply voltage (for example, ground) during the second mode, thereby aiding the level shifter in turning off the RF switch in the second mode.

Accordingly, when the RF system operates in a primary or normal operating mode associated with the first state of the mode signal, the level shifter operates using a power high supply voltage and a charge pump voltage. In one example, when mode signal is in the first state, the level shifter operates between a power high supply voltage of about +2.5 V and a negative charge pump voltage of about −2.0 V. Additionally, when RF system operates in a standby mode associated with the second state of the mode signal, the level shifter control circuit controls the charge pump voltage and the bias voltage such that the level shifter turns off the RF switch. In one example, when mode signal is in the second state, the level shifter control circuit controls the charge pump voltage to a power low supply voltage of about 0 V. Although various example voltage levels have been provided, any suitable voltage levels can be used.

The level shifters described herein can be used to generate switch control signals that have desirable voltage levels both when a charge pump is enabled and when the charge pump is disabled. Thus, the gate voltages of the RF switches can be properly controlled in both primary and standby modes. Controlling the RF switches in this manner can enhance RF isolation and/or otherwise enhance performance.

FIG. 1 is a schematic diagram of one embodiment of an integrated circuit (IC) 10. The illustrated IC 10 includes a first pin 5a that receives a first or power low supply voltage $V_1$ and a second pin 5b that receives a second or power high supply voltage $V_2$. Additionally, the illustrated IC 10 further includes switches 12, a charge pump 22, and a switch controller 23. Although not illustrated in FIG. 1 for clarity of the figures, the IC 10 typically includes additional pins and circuitry.

The charge pump 22 can be used to generate a charge pump voltage that has a voltage level less than that of the power low supply voltage $V_1$. The switch controller 23 receives the charge pump voltage, which can be used in part to control the switches 12.

For example, the illustrated IC 10 can represent a front-end module (FEM) and/or antenna switch module (ASM), and the switches 12 can include n-type metal oxide semiconductor (NMOS) switch transistors including gates that are biased to a voltage level of the charge pump voltage when in the off state. Controlling the gate voltage of an NMOS switch transistor to a voltage below a power low supply voltage in the off state can increase off state impedance, which can enhance isolation in multi-band applications.

When the NMOS switch transistors operate in the on state, the NMOS switch transistors can be biased to any suitable voltage level, such as the voltage level of the power high supply voltage $V_2$. In certain configurations, the power high supply voltage $V_2$ can correspond to a regulated voltage generated by an on-chip or off-chip regulator. Generating the power high supply voltage $V_2$ using a regulator can aid in controlling NMOS switch transistors operating in the on-state with a voltage level that is relatively constant with respect to temperature, battery voltage level, and/or current loading.

In certain configurations, the IC 10 is fabricated using a silicon on insulator (SOI) process, and the switches 12 can include SOI transistors. However, other configurations are possible.

Figure 2:
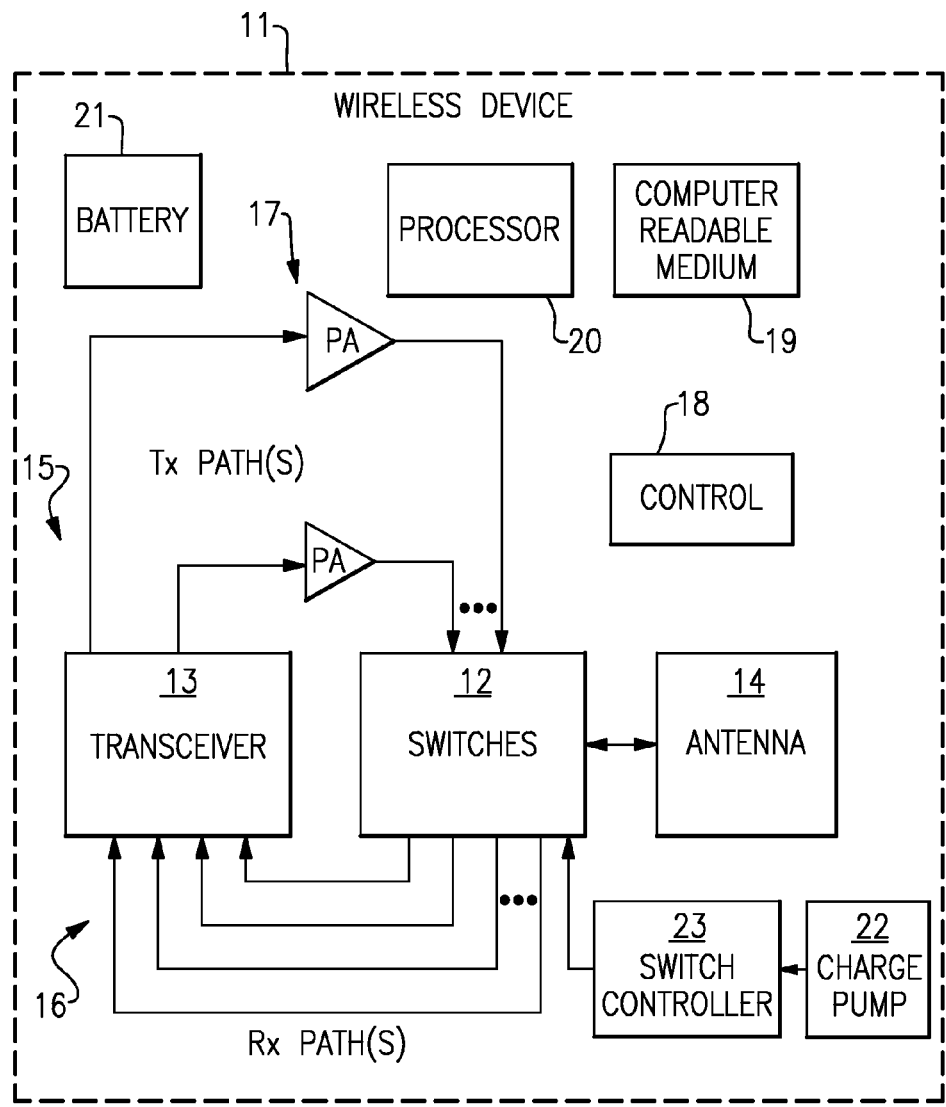
FIG. 2 is a schematic block diagram of one embodiment of a wireless device.

FIG. 2 is a schematic block diagram of one embodiment of a wireless device 11.

The example wireless device 11 depicted in FIG. 2 can represent a multi-band and/or multi-mode device such as a multi-band/multi-mode mobile phone. In the illustrated configuration, the wireless device 11 includes switches 12, a transceiver 13, an antenna 14, power amplifiers 17, a control component 18, a computer readable medium 19, a processor 20, a battery 21, a charge pump 22, and a switch controller 23.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can be adapted to include more or fewer transmission paths 15.

The power amplifiers 17 can be used to amplify a wide variety of RF signals, including, for example, Global System for Mobile (GSM) signals, code division multiple access (CDMA) signals, W-CDMA signals, wireless local area network (WLAN) signals, Long Term Evolution (LTE) signals, and/or EDGE signals.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain configurations, the switches 12 can include a number of switches that provide functionalities associated with, for example, switching between different bands, switching between different power modes, switching between transmission and receiving modes, or some combination thereof. The switches 12 can also provide additional functionality, including filtering and/or duplexing of signals.

The charge pump 22 can be used to generate a charge pump voltage that can be used for a variety of purposes in the wireless device 11. For example, in certain configurations the charge pump voltage generated by the charge pump 22 can be provided to the switch controller 23 and used in part to bias the switches 12.

FIG. 2 shows that in certain configurations, a control component 18 can be provided for controlling various control functionalities associated with operations of the switches 12, the power amplifiers 17, the charge pump 22, the switch controller 23 and/or other operating component (s). In certain configurations, the control component 18 generates a mode signal and/or one or more switch enable signals that are provided to the switch controller 23. Accordingly, the control component 18 can be used to operate the switch controller 23 in a standby mode at certain time instances. When operating in the standby mode, the control component 18 can disable or turn off the charge pump 22 using the mode signal.

In certain configurations, a processor 20 can be configured to facilitate implementation of various processes described herein. The processor 20 can operate using computer program instructions. These computer program instructions may be provided to the processor 20.

In certain configurations, these computer program instructions may also be stored in a computer-readable memory 19 that can direct the processor 20 or other programmable data processing apparatus to operate in a particular manner.

The battery 21 can be any suitable battery for use in the wireless device 11, including, for example, a lithium-ion battery. In certain configurations, a battery voltage generated by the battery 21 is regulated to generate a power high supply voltage used in part to control the switches 12.

Figure 3:
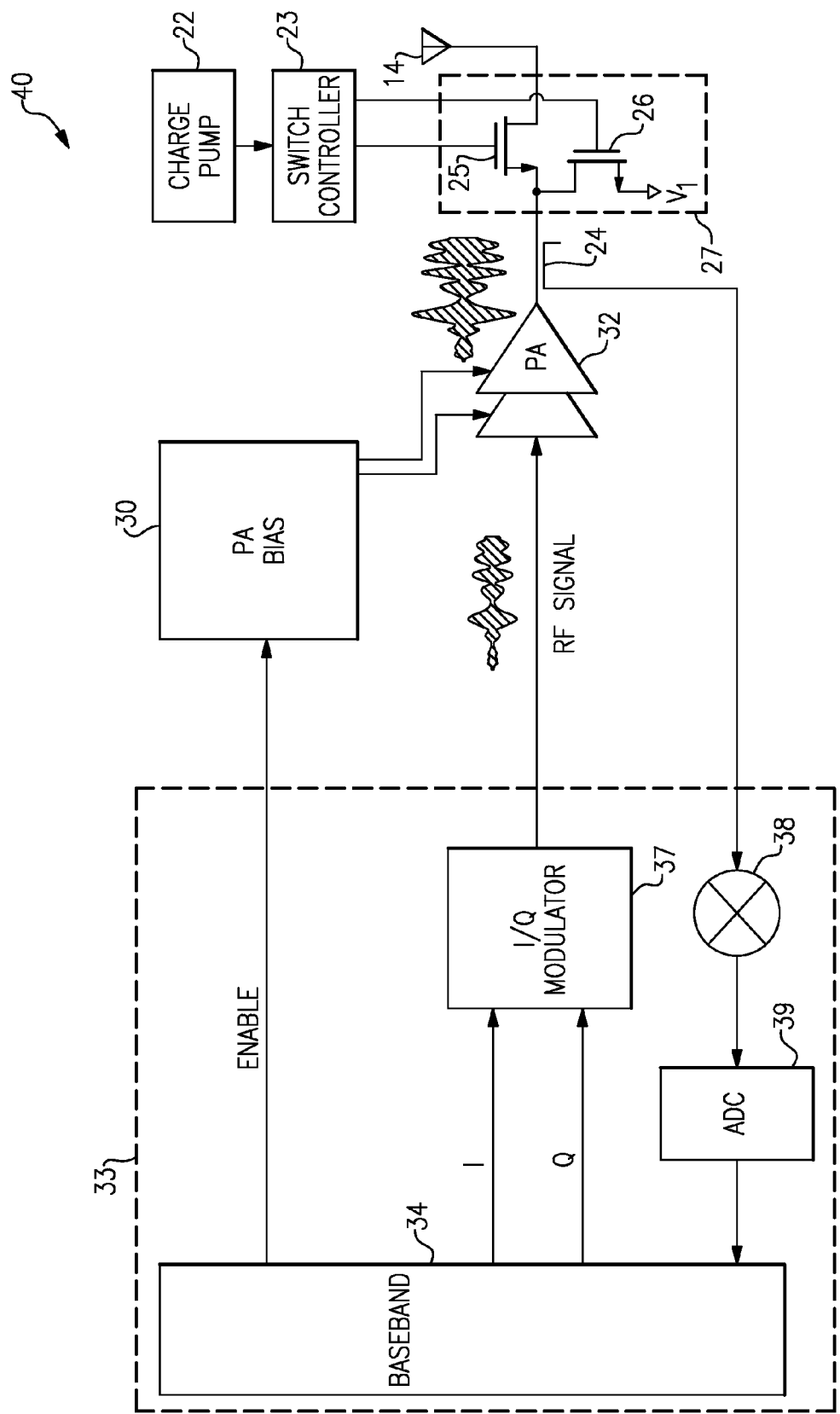
FIG. 3 is a schematic block diagram of one embodiment of a power amplifier system.

FIG. 3 is a schematic block diagram of one embodiment of a power amplifier system 40. The illustrated power amplifier system 40 includes an RF switching circuit 27 that includes a series switch transistor 25 and a shunt switch transistor 26. The illustrated power amplifier system 40 further includes a charge pump 22, a switch controller 23, a directional coupler 24, a power amplifier bias circuit 30, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 40.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 30 can receive an enable signal ENABLE from the baseband processor 34, and can use the enable signal ENABLE to generate one or more bias signals for the power amplifier 32. The power amplifier 32 can receive the RF signal from the I/Q modulator 37 of the transceiver 33.

The switch controller 23 can turn on and off the series switch transistor 25 and the shunt switch transistor 26 in a complementary manner. For example, the switch controller 23 can be used to turn on the series switch transistor 25 and turn off the shunt switch transistor 26 such that the power amplifier 32 provides an amplified RF signal to the antenna 14 through the series switch transistor 25. Additionally, the switch controller 23 can be used to turn off the series switch transistor 25 and turn on the shunt switch transistor 26 to provide a high impedance path between the output of the power amplifier 32 and the antenna 14 while providing termination to the power amplifier's output. To control a state of the RF switching circuit 27, the switch controller 23 can receive a switch enable signal (not illustrated in FIG. 3) from any suitable circuitry, such as the control component 18 of FIG. 2.

The directional coupler 24 can be positioned between the output of the power amplifier 32 and the source of the series switch transistor 25, thereby allowing an output power measurement of the power amplifier 32 that does not include insertion loss of the series switch transistor 25. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34.

By including a feedback path between the output of the power amplifier 32 and the baseband processor 34, the baseband processor 34 can be configured to dynamically adjust the I and Q signals to optimize the operation of the power amplifier system 40. For example, configuring the power amplifier system 40 in this manner can aid in controlling the power added efficiency (PAE) and/or linearity of the power amplifier 32.

In the illustrated configuration, the charge pump 22 provides a charge pump voltage to switch controller 23 used to control the series switch transistor 25 and the shunt switch transistor 26. In certain configurations, the charge pump voltage is used to bias the gate voltage of the series switch transistor 25 and/or the shunt switch transistor 26 when the series switch transistor 25 and/or the shunt switch transistor 26 is turned off. For example, the charge pump 22 can generate a negative charge pump voltage used to turn off the series switch transistor 25 and/or the shunt switch transistor 26.

Although the switch controller 23 is illustrated as generating switch control signals for two transistors, the switch controller 23 can be adapted to control more or fewer switch control transistors. For example, a switch controller can receive multiple switch enable signals and generate multiple switch control signals for controlling different RF switching circuits.

Overview of Examples of Switch Controllers

Apparatus and methods for controlling radio frequency (RF) switches are disclosed. In certain configurations, a switch controller includes a level shifter control circuit and a level shifter. The level shifter control circuit generates a bias voltage for biasing the level shifter, and the bias voltage is controlled to different voltage levels based on a state of a mode signal. The level shifter is powered by a power high supply voltage and a charge pump voltage. When the mode signal is in a first state, the level shifter level shifts a switch enable signal to generate one or more switch control signals for one or more RF switches. Additionally, the level shifter control circuit generates the bias voltage to have a voltage level that tracks the charge pump voltage to aid the level shifter in level shifting the switch enable signal. However, when the mode signal is in a second state, a charge pump that generates the charge pump voltage can be disabled. Thus, the level shifter control circuit can control the bias voltage to a fixed voltage level, and can control the charge pump voltage and the one or more switch control signals to turn off the RF switches.

Accordingly, when the mode signal is in a first state, the level shifter level shifts the switch enable signal to generate one or more switch control signals having voltage levels associated with a power high supply voltage and/or a charge pump voltage. Additionally, when the mode signal is in a second state, the level shifter control circuit can control the charge pump voltage and the one or more level shifters to a voltage level of a power low supply voltage to turn off the RF switches. Thus, the switch controller can be used to control RF switches to desirable voltage levels, even when operating in the second state.

Figure 4:
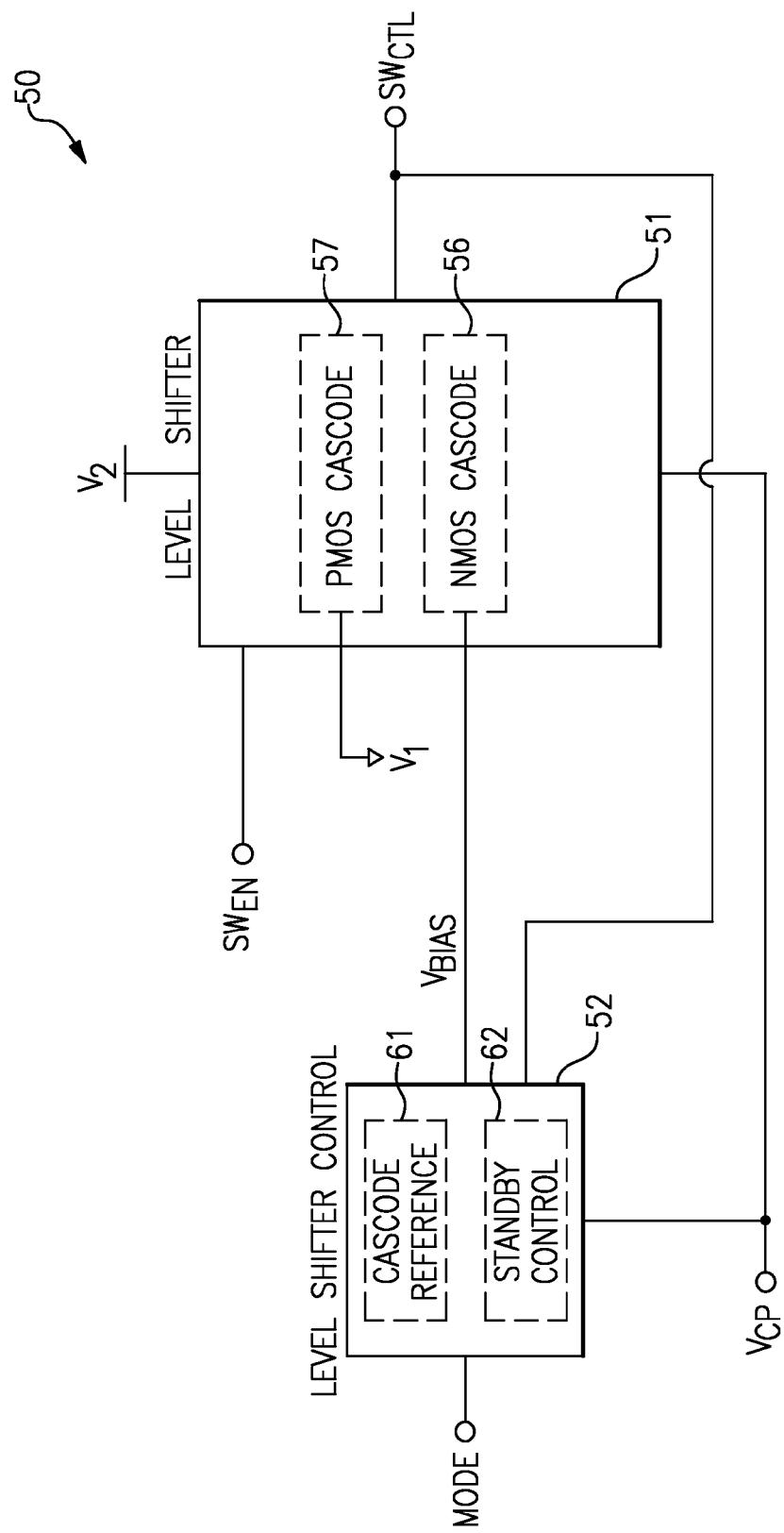
FIG. 4 is a schematic block diagram of one embodiment of a switch controller.

FIG. 4 is a schematic block diagram of one embodiment of a switch controller 50. The switch controller 50 includes a level shifter 51 and a level shifter control circuit 52.

As shown in FIG. 4, the level shifter 51 receives a switch enable signal $SW_{EN}$ and generates a switch control signal $SW_{CTL}$, which can be used to turn on or off an RF switch (for example, an NMOS transistor). In certain configurations, the level shifter 51 generates two or more switch control signals. For example, in certain configurations, the level shifter 51 can generate a non-inverted switch control signal used to control a series RF switch (for example, the series switch transistor 25 of FIG. 3) and an inverted switch control signal used to control a shunt RF switch (for example, the shunt switch transistor 26 of FIG. 3). However, other configurations are possible.

The illustrated level shifter 51 includes NMOS cascode transistors 56 and PMOS cascode transistors 57. In certain configurations, each of the NMOS cascode transistors 56 is paired with a corresponding one of the PMOS cascode transistors 57, and each pair of transistors is stacked or arranged in series between a power high supply voltage $V_2$ and a charge pump voltage $V_{CP}$. As shown in FIG. 4, the NMOS cascode transistors 56 are biased using a bias voltage $V_{BIAS}$ generated by the level shifter control circuit 52, and the PMOS cascode transistors 57 are biased using a power low supply voltage $V_1$.

The level shifter control circuit 52 receives a mode signal MODE, which can operate in one of multiple states including a first state and a second state. Additionally, the level shifter control circuit 52 controls a voltage level of the bias voltage $V_{BIAS}$ based on the state of the mode signal MODE.

The illustrated level shifter control circuit 52 includes a cascode reference circuit 61, which generates a cascode reference voltage that changes with a voltage level of the charge pump voltage $V_{CP}$. In certain configurations, the level shifter control circuit 52 can control the bias voltage $V_{BIAS}$ to the cascode reference voltage when the mode signal MODE is in the first state. Additionally, when the mode signal MODE is in the second state, the level shifter control circuit 52 can control the bias voltage $V_{BIAS}$ to a substantially fixed voltage, such as a voltage level of the power high supply voltage $V_2$ or any other suitable DC voltage.

The level shifter control circuit 52 further includes a standby control circuit 62, which can aid in providing control when the mode signal MODE is in the second state. In certain configurations, the level shifter control circuit 52 can control a voltage level of the charge pump voltage $V_{CP}$ when the mode signal MODE is in the second state. For example, when operating in the standby mode, the charge pump that generates the charge pump voltage $V_{CP}$ can be disabled, and the charge pump voltage $V_{CP}$ can be electrically floating. In certain implementations, the standby control circuit 62 can control the charge pump voltage $V_{CP}$ using the power low supply voltage $V_1$ when the mode signal MODE is in the second state.

In certain configurations, the standby control circuit 62 can also be used to control the voltage levels of one or more switch control signals during standby. For example, the standby control circuit 62 can be used to control the voltage level of the switch control signal $SW_{CTL}$ to the power low supply voltage $V_1$ during standby.

Although FIG. 4 illustrates a configuration in which the switch controller 50 includes one level shifter, the switch controller 50 can be adapted to included additional level shifters. In such configurations, a level shifter control circuit can be shared by all or part of the level shifters.

Figure 5:
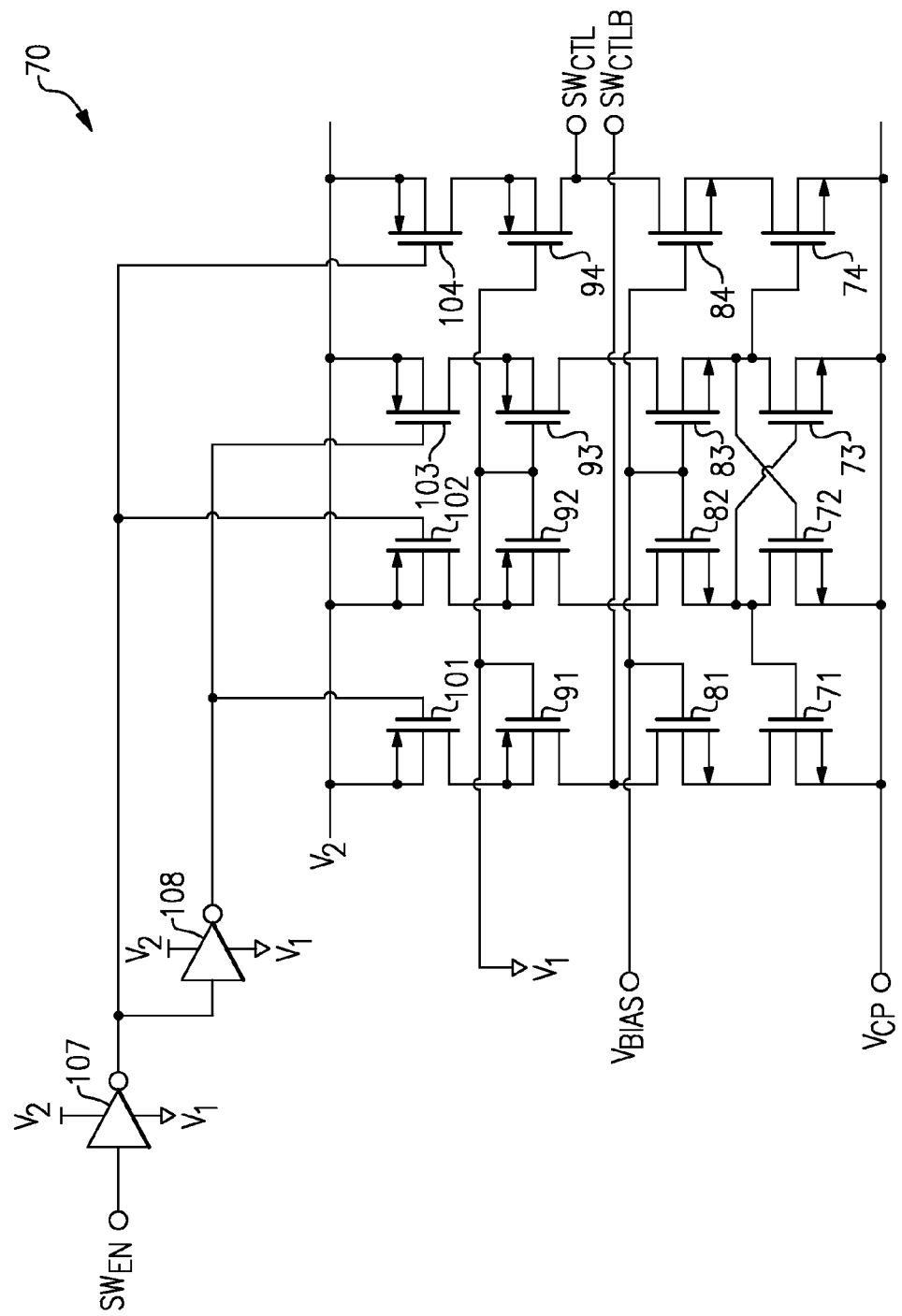
FIG. 5 is a circuit diagram of one embodiment of a level shifter.

FIG. 5 is a circuit diagram of one embodiment of a level shifter 70. The level shifter 70 includes first to fourth NMOS level-shifting transistors 71-74, first to first NMOS cascode transistors 81-84, first to fourth PMOS cascode transistors 91-94, first to fourth PMOS level-shifting transistors 101-104, a first inverter 107, and a second inverter 108. The level shifter 70 receives a switch enable signal $SW_{EN}$ and a bias voltage $V_{BIAS}$, and generates a non-inverted switch control signal $SW_{CTL}$ and an inverted switch control signal $SW_{CTLB}$.

As shown in FIG. 5, the first NMOS level-shifting transistor 71, the first NMOS cascode transistor 81, the first PMOS cascode transistor 91, and the first PMOS level-shifting transistor 101 are stacked or arranged in series between the power high supply voltage $V_2$ and the charge pump voltage $V_{CP}$. Additionally, the second NMOS level-shifting transistor 72, the second NMOS cascode transistor 82, the second PMOS cascode transistor 92, and the second PMOS level-shifting transistor 102 are stacked between the power high supply voltage $V_2$ and the charge pump voltage $V_{CP}$. Furthermore, the third NMOS level-shifting transistor 73, the third NMOS cascode transistor 83, the third PMOS cascode transistor 93, and the third PMOS level-shifting transistor 103 are stacked between the power high supply voltage $V_2$ and the charge pump voltage $V_{CP}$. Additionally, the fourth NMOS level-shifting transistor 74, the fourth NMOS cascode transistor 84, the fourth PMOS cascode transistor 94, and the fourth PMOS level-shifting transistor 104 are stacked between the power high supply voltage $V_2$ and the charge pump voltage $V_{CP}$.

The gates of the first to fourth NMOS cascode transistors 81-84 are biased using the bias voltage $V_{BIAS}$, and the gates of the first to fourth PMOS cascode transistors 91-94 are biased using the power low supply voltage $V_1$. The gate of the first NMOS level-shifting transistor 71 and the gate of the third NMOS level-shifting transistor 73 are electrically connected to the drain of the second NMOS level-shifting transistor 72. Additionally, the gate of the second NMOS level-shifting transistor 72 and the gate of the fourth NMOS level-shifting transistor 74 are electrically connected to the drain of the third NMOS level-shifting transistor 73.

The first and second inverters 107, 108 are powered using the power high supply voltage $V_2$ and the power low supply voltage $V_1$. Additionally, the first inverter 107 includes an input that receives the switch enable signal $SW_{EN}$ and an output that provides an inverted version of the switch enable signal $SW_{EN}$ to the input of the second inverter 108, to the gate of the second PMOS level-shifting transistor 102 and to the gate of the fourth PMOS level-shifting transistor 104. The second inverter 108 includes an output that provides a non-inverted version of the switch enable signal $SW_{EN}$ to the gate of the first level-shifting PMOS transistor 101 and to the gate of the third level-shifting PMOS transistor 103.

The level shifter 70 of FIG. 5 illustrates one embodiment of a level shifter that can be used in the switch controller 50 of FIG. 4. However, other configurations of level shifters can be used in accordance with the teachings herein.

With reference to FIGS. 4 and 5, when the mode signal MODE is in the first state, the illustrated level shifter 70 of FIG. 5 can level shift the switch enable signal $SW_{EN}$ from a voltage domain associated with the power high supply voltage $V_2$ and the power low supply voltage $V_1$ to a voltage domain associated with the power high supply voltage $V_2$ and the charge pump voltage $V_{CP}$. For example, when the switch enable signal $SW_{EN}$ is logically high, the non-inverted switch control signal $SW_{CTL}$ can have a voltage level about equal to that of the power high supply voltage $V_2$ and the inverted switch control signal $SW_{CTLB}$ can have a voltage level about equal to that of the charge pump voltage $V_{CP}$. Additionally, when the switch enable signal $SW_{EN}$ is logically low, the non-inverted switch control signal $SW_{CTL}$ can have a voltage level about equal to that of the charge pump voltage $V_{CP}$ and the inverted switch control signal $SW_{CTLB}$ can have a voltage level about equal to that of the power high supply voltage $V_2$.

The bias voltage $V_{BIAS}$ has a voltage level that changes based on a state of the mode signal MODE. For example, when the mode signal MODE is in the first state, the voltage level of the bias voltage $V_{BIAS}$ can be generated by a cascode reference circuit and can dynamically track the charge pump voltage $V_{CP}$. Configuring the bias voltage $V_{BIAS}$ in this manner can aid in biasing the gates of the NMOS cascode transistors 81-84 during level shifting operations of the level shifter 70 in the presence of variation and/or settling of the charge pump voltage $V_{CP}$.

However, when the mode signal MODE is in the second state, the charge pump that generates the charge pump voltage $V_{CP}$ can be turned off. Additionally, the level shifter control circuit 52 can control the bias voltage $V_{BIAS}$ to a fixed voltage level, such as a voltage of the power high supply voltage $V_2$.

Accordingly, the voltage level of the bias voltage $V_{BIAS}$ can change based on a state of the mode signal MODE.

With continuing reference to FIGS. 4 and 5, in certain configurations, the level shifter control circuit 52 is configured to control the voltage level of the charge pump voltage $V_{CP}$ and the voltage levels of the non-inverted switch control signal $SW_{CTL}$ and the inverted switch control signal $SW_{CTLB}$ during standby. For example, when the mode signal MODE is in the second state, the level shifter control circuit 52 can be configured to control the voltage level of the charge pump voltage $V_{CP}$ and the voltage levels of the non-inverted switch control signal $SW_{CTL}$ and the inverted switch control signal $SW_{CTLB}$ using the power low supply voltage $V_1$.

Additional details of the level shifter 70 can be as described earlier.

Figure 6:
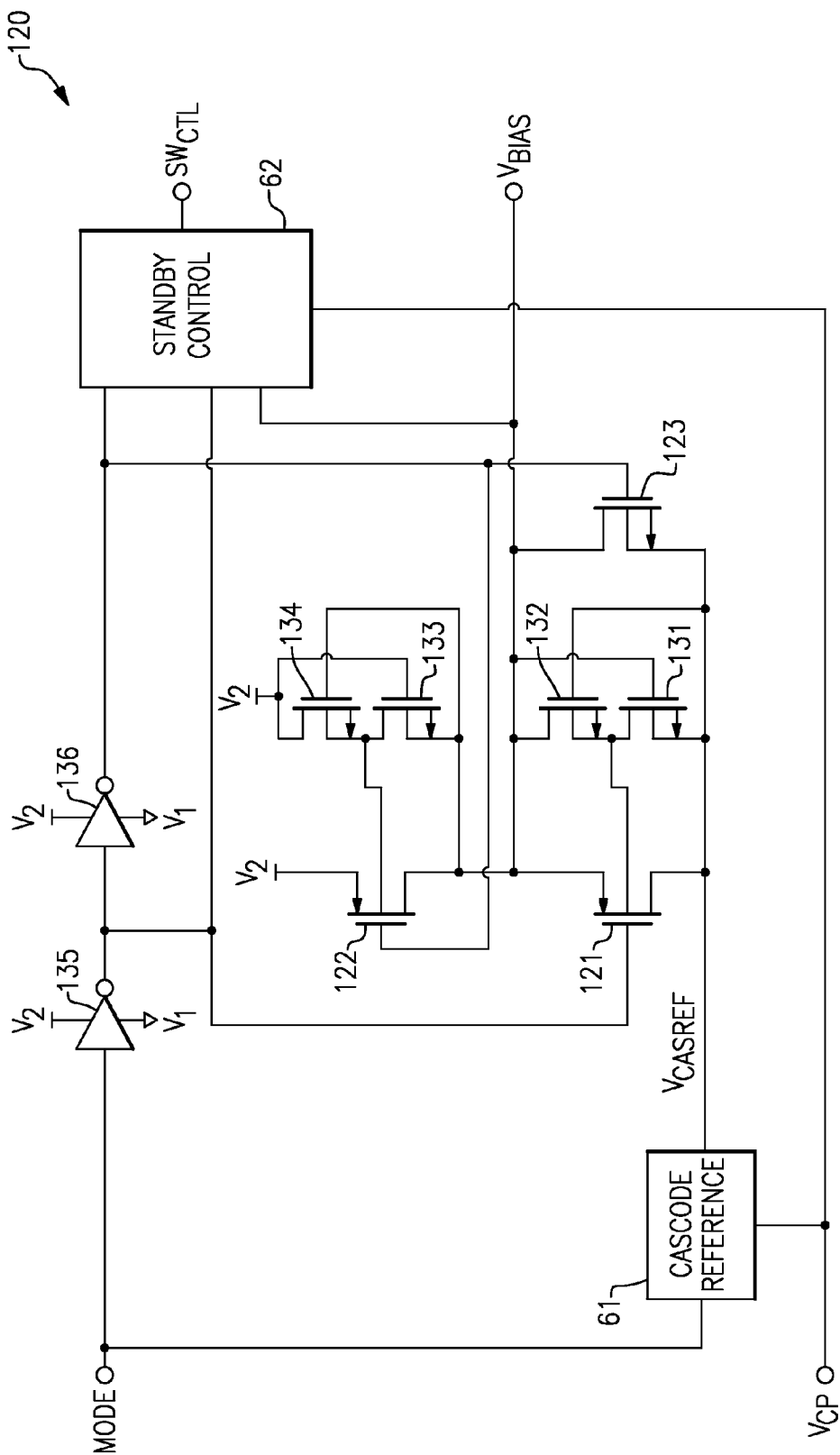
FIG. 6 is a circuit diagram of one embodiment of a level shifter control circuit.

FIG. 6 is a circuit diagram of one embodiment of a level shifter control circuit 120. The level shifter control circuit 120 includes a cascode reference circuit 61, a standby control circuit 62, a first inverter 135, a first PMOS level shifter control transistor 121, a second PMOS level shifter control transistor 122, an NMOS level shifter control transistor 123, first to fourth NMOS body-biasing transistors 131-134, a first inverter 135, and a second inverter 136. The level shifter control circuit 120 generates the bias voltage $V_{BIAS}$ based on the state of the mode signal MODE.

The level shifter control circuit 120 of FIG. 6 illustrates one embodiment of a level shifter control circuit that can be used in the switch controller 50 of FIG. 4. However, other configurations of level shifter control circuits can be used in accordance with the teachings herein.

The cascode reference circuit 61 receives the mode signal MODE and the charge pump voltage $V_{CP}$. Additionally, the cascode reference circuit 61 generates the cascode reference voltage $V_{CASREF}$ based on a state of the mode signal MODE. In certain configurations, the cascode reference voltage $V_{CASREF}$ dynamically tracks a voltage level of the charge pump voltage $V_{CP}$ when the mode signal MODE is in the first state. Additionally, when the mode signal MODE is in the second state, the cascode reference circuit 61 can generate the cascode reference voltage $V_{CASREF}$ to have a voltage level that is about equal to the power low supply voltage $V_1$. However, other configurations are possible.

The first and second inverters 135, 136 are powered using the power high supply voltage $V_2$ and the power low supply voltage $V_1$. The first inverter 135 includes an input that receives the mode signal MODE, and an output that provides an inverted version of the mode signal to the input of the second inverter 136, to the gate of the first PMOS level shifter control transistor 121, and to the standby control circuit 62. The second inverter 136 further includes an output that provides a non-inverted version of the mode signal MODE to the gate of the second PMOS level shifter control transistor 122, to the gate of the NMOS level shifter control transistor 123, and to the standby control circuit 62.

The first and second PMOS level shifter control transistors 121, 122 and the NMOS level shifter control transistor 123 can be used to control the voltage level of the bias voltage $V_{BIAS}$. For example, when the mode signal MODE is logically high, the first PMOS level shifter control transistor 121 and the NMOS level shifter control transistor 123 can be turned on to control the voltage level of the bias voltage $V_{BIAS}$ to be about equal to the cascode reference voltage $V_{CASREF}$. Configuring the level shifter control circuit 120 to include a PMOS transistor and an NMOS transistor that operate in parallel to control the bias voltage $V_{BIAS}$ can aid in providing a robust electrical connection across variations in process, supply voltage, and/or temperature. Additionally, when the mode signal MODE is logically low, the second PMOS level shifter control transistor 122 can control the voltage level of the bias voltage $V_{BIAS}$ to be about equal to the power high supply voltage $V_2$.

The first to fourth NMOS body biasing transistors 131-134 can be used to bias the bodies of the first and second PMOS level shifter control transistors 121, 122. As shown in FIG. 6, the first and second NMOS body biasing transistors 131, 132 are electrically connected in series between the cascode reference voltage $V_{CASREF}$ and the bias voltage $V_{BIAS}$, and the third and fourth NMOS body biasing transistors 133, 134 are electrically connected in series between the bias voltage $V_{BIAS}$ and the power high supply voltage $V_2$. Additionally, the gate of the second NMOS body biasing transistor 132 is electrically connected to the cascode reference voltage $V_{CASREF}$, the gate of the third NMOS body biasing transistor 133 is electrically connected to the power high supply voltage $V_2$, and the gates of the first and fourth NMOS body biasing transistors 131, 134 are electrically connected to the bias voltage $V_{BIAS}$. Configuring the NMOS body biasing transistors 131-134 in this manner can aid in biasing the bodies of the first and second PMOS level shifter control transistors 121, 122 to prevent parasitic drain-to-body and/or source-to-body diodes from becoming forward-biased over various operating conditions.

When the mode signal MODE is in the first state (normal operating mode), the charge pump voltage $V_{CP}$ can be controlled using a charge pump (not shown in FIG. 6). When the mode signal MODE is in the second state (standby mode), the standby control circuit 62 can be used to control the charge pump voltage $V_{CP}$ to be about equal to the power low supply voltage $V_1$. In certain configurations, the standby control circuit 62 can also be used to control a state of one or more switch control signals (such as the switch control signal $SW_{CTL}$) when the mode signal MODE is in the second state.

Figure 7:
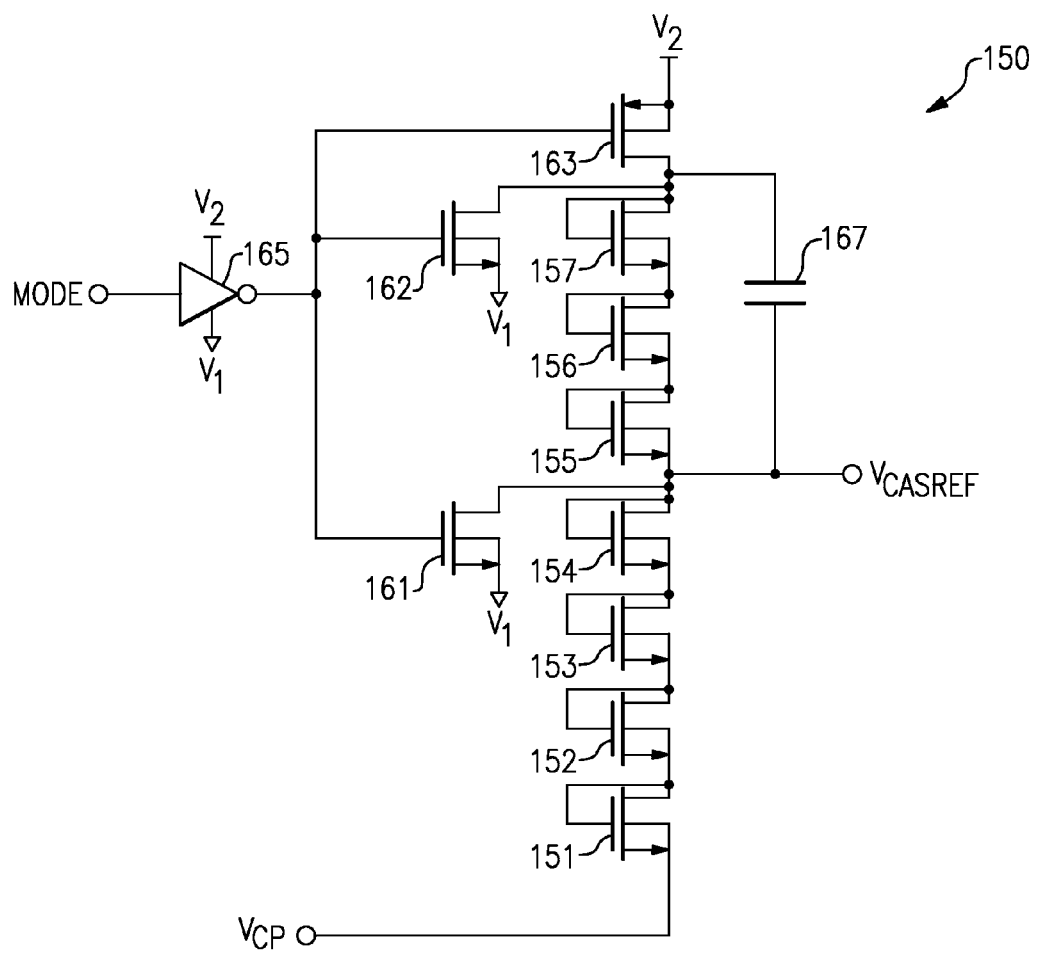
FIG. 7 is a circuit diagram of one embodiment of a cascode reference circuit.

FIG. 7 is a circuit diagram of one embodiment of a cascode reference circuit 150. The cascode reference circuit 150 includes first to seventh NMOS voltage divider transistors 151-157, a first NMOS control transistor 161, a second NMOS control transistor 162, a PMOS control transistor 163, an inverter 165, and a bypass capacitor 167.

The cascode reference circuit 150 of FIG. 7 illustrates one embodiment of a cascode reference circuit that can be included in a level shifter control circuit, such as the level shifter control circuit 120 of FIG. 6. However, other configurations of cascode reference circuits can be used in accordance with the teachings herein.

The first to seventh NMOS voltage divider transistors 151-157 are electrically connected in series with the PMOS control transistor 163 between the charge pump voltage $V_{CP}$ and the power high supply voltage $V_2$. As shown in the FIG. 7, the first to seventh NMOS voltage divider transistors 151-157 are each diode-connected, and arranged as a voltage divider between the power high supply voltage $V_2$ and the charge pump voltage $V_{CP}$. Although one example of a voltage divider is illustrated, a voltage divider can be implemented in other ways, including, for example, configurations using more or fewer transistors and/or using other electrical components, such as resistors.

The inverter 165 is powered using the power high supply voltage $V_2$ and the power supply voltage $V_1$. The inverter 165 includes an input that receives the mode signal MODE and an output that provides an inverted version of the mode signal to the gates of the PMOS control transistor 163 and the first and second NMOS control transistors 161, 162.

When the mode signal MODE is logically high, the first and second NMOS control transistors 161, 162 can be turned off and the PMOS control transistor 163 can be turned on. Additionally, the first to seventh NMOS voltage divider transistors 151-157 can operate as a voltage divider that generates the cascode reference voltage $V_{CASREF}$ to be about equal to $V_{CP}$ 4/7*($V_2-V_{CP}$). Thus, the cascode reference voltage $V_{CASREF}$ can dynamically track the charge pump voltage $V_{CP}$ in a first state of the mode signal MODE. However, when the mode signal MODE is logically low, the first and second NMOS control transistors 161, 162 can be turned on and the PMOS control transistor 163 can be turned off. In such a configuration, the cascode reference voltage $V_{CASREF}$ can be controlled to the voltage level of the power low supply voltage $V_1$.

The illustrated configuration includes the bypass capacitor 167, which is electrically connected between the drain of the PMOS control transistor 163 and the cascode reference voltage $V_{CASREF}$. Including the bypass capacitor 167 can aid in reducing noise of the cascode reference voltage $V_{CASREF}$.

Figure 8:
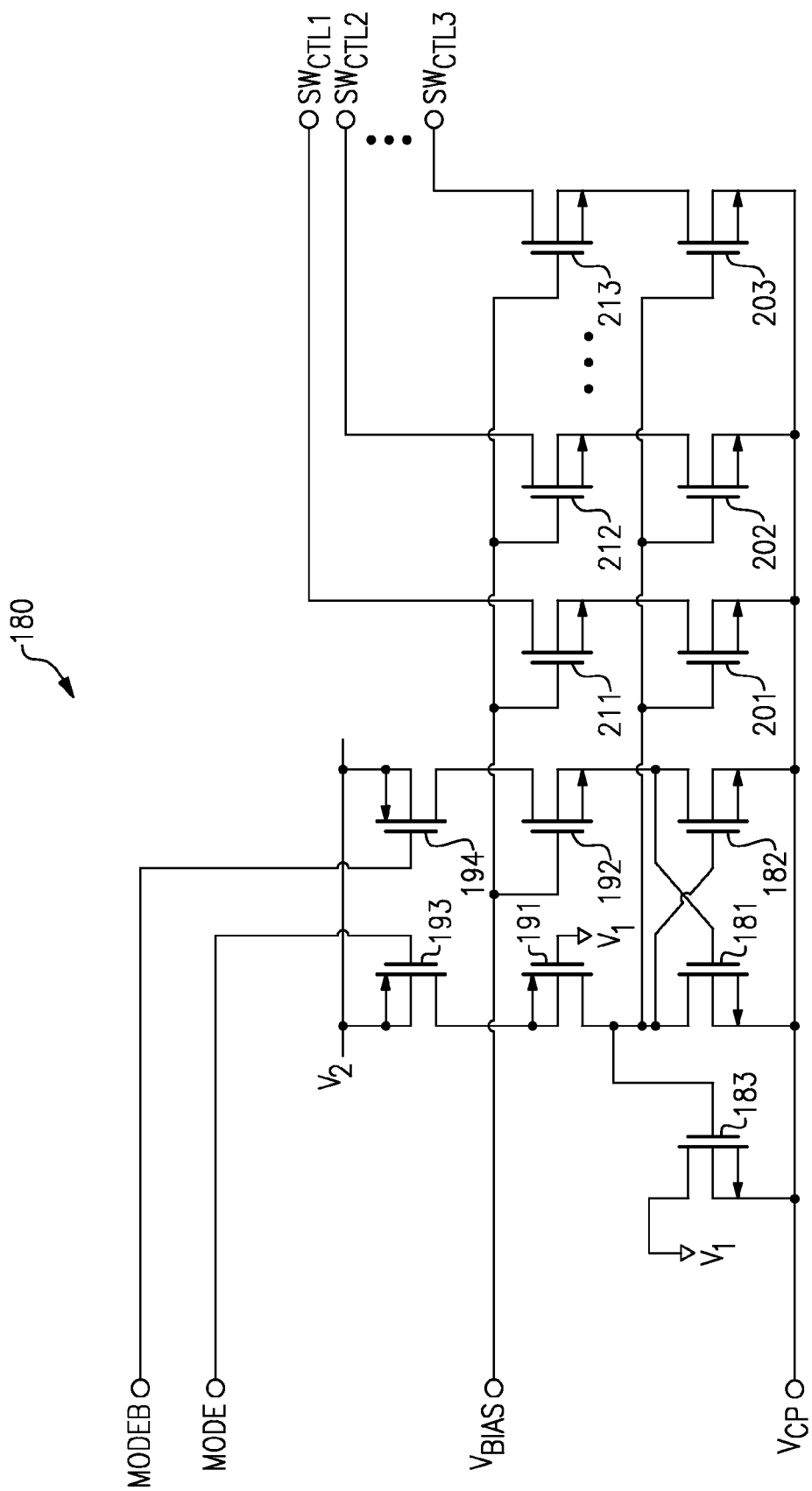
FIG. 8 is a circuit diagram of one embodiment of a standby control circuit.

FIG. 8 is a circuit diagram of one embodiment of a standby control circuit 180. The standby control circuit 180 includes an NMOS charge pump voltage control transistor 183, a first NMOS standby control transistor 181, a second NMOS standby control transistor 182, a PMOS cascode transistor 191, an NMOS cascode transistor 192, a first PMOS standby control transistor 193, a second standby control transistor 194, first to third NMOS switch control transistors 201-203, and first to third NMOS switch control cascode transistors 211-213.

The standby control circuit 180 of FIG. 8 illustrates one embodiment of a standby control circuit that can be included in a level shifter control circuit, such as the level shifter control circuit 120 of FIG. 6. However, other configurations of standby control circuit can be used in accordance with the teachings herein.

The first NMOS standby control transistor 181, the PMOS cascode transistor 191, and the first PMOS standby control transistor 193 are electrically connected in series between the charge pump voltage $V_{CP}$ and the power high supply voltage $V_2$. Additionally, the second NMOS standby control transistor 182, the NMOS cascode transistor 192, and the second standby control transistor 194 are electrically connected in series between the charge pump voltage $V_{CP}$ and the power high supply voltage $V_2$. The gate of the first NMOS standby control transistor 181 is electrically connected to the drain of the second NMOS standby control transistor 182, and the gate of the second NMOS standby control transistor 182 is electrically connected to the drain of the first NMOS standby control transistor 181. Furthermore, the gate of the PMOS cascode transistor 191 is electrically connected to the power low supply voltage $V_1$, and the gate of the NMOS cascode transistor 192 is electrically connected to the bias voltage $V_{BIAS}$. Additionally, the gate of the first PMOS standby control transistor 193 is electrically connected to the mode signal MODE, and the gate of the second PMOS standby control transistor 194 is electrically connected to the inverted mode signal MODEB.

The NMOS charge pump voltage control transistor 183 includes a source and body electrically connected to the charge pump voltage $V_{CP}$, a drain electrically connected to the power low supply voltage $V_1$, and a gate electrically connected to the drain of the first NMOS standby control transistor 181. When the mode signal MODE is logically high, the NMOS charge pump voltage control transistor 183 can be turned off, and a charge pump can generate the charge pump voltage $V_{CP}$ to have a voltage level less than that of the power low supply voltage $V_1$.

However, when the mode signal MODE is logically low, the NMOS charge pump voltage control transistor 183 can be turned on, and the standby control circuit 180 can control the charge pump voltage $V_{CP}$ to have a voltage level that is about equal to that of the power low supply voltage $V_1$. Thus, the standby control circuit 180 can be used to prevent the charge pump voltage $V_{CP}$ from electrically floating during standby mode.

In the illustrated configuration, the standby control circuit 180 is illustrated as including switch control transistors associated with a first switch control signal $SW_{CTL1}$, a second switch control signal $SW_{CTL2}$, and a third switch control signal $SW_{CTL3}$. The first to third switch control signal $SW_{CTL1}$-$SW_{CTL3}$ can be generated by level shifters associated with different switches. Although a configuration associated with three switch control signals is shown, the standby control circuit 180 can be adapted to provide standby control for more or fewer switch control signals.

The gates of the first to third NMOS switch control transistors 201-203 are electrically connected to the drain of the first NMOS standby control transistor 181. Additionally, the gates of the first to third NMOS switch control cascode transistors 211-213 are electrically connected to the bias voltage $V_{BIAS}$. The first NMOS switch control transistor 201 and the first NMOS switch control cascode transistor 211 are electrically connected in series. Similarly, the second NMOS switch control transistor 202 and the second NMOS switch control cascode transistor 212 are electrically connected in series, and the third NMOS switch control transistor 203 and the second NMOS switch control cascode transistor 213 are electrically connected in series.

When the mode signal MODE is logically high, the first to third NMOS switch control transistors 201-203 can be turned off and the standby control circuit 180 should not control the first to third switch control signal $SW_{CTL1}$-$SW_{CTL3}$. Configuring the standby control circuit 180 in this manner can prevent the standby control circuit 180 from interfering with the operation of level shifters that control the voltage levels of the first to third switch control signal $SW_{CTL1}$-$SW_{CTL3}$ during normal operation. However, when the mode signal MODE is logically low, the switch controller can operate in a standby mode, and the standby control circuit 180 can control each of the first to third switch control signal $SW_{CTL1}$-$SW_{CTL3}$ to be about equal to the power low supply voltage $V_1$.

Figure 9:
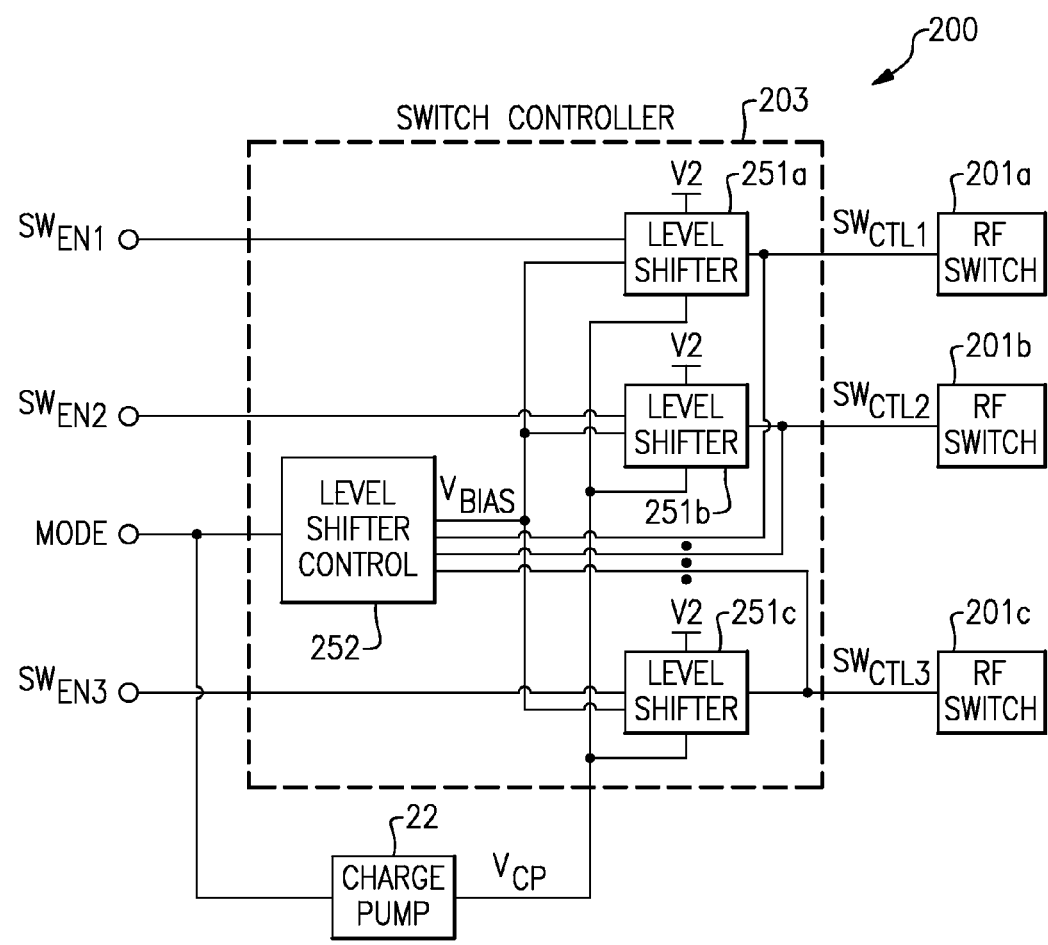
FIG. 9 is a schematic block diagram of a radio frequency system according to one embodiment.

FIG. 9 is a schematic block diagram of an RF system 200 according to one embodiment. The RF system 200 includes a charge pump 22, a first RF switch 201a, a second RF switch 201b, a third RF switch 201c, and a switch controller 203. Although the RF system 200 is illustrated as including three RF switches, the RF system 200 can be adapted to include more or fewer RF switches.

The charge pump 22 receives a mode signal MODE and generates a charge pump voltage $V_{CP}$. The charge pump 22 is enabled in a first state of the mode signal MODE and disabled in a second state of the mode signal MODE. For example, the first state can indicate a normal operating mode of the RF system 200 and the second state can indicate a standby mode of the RF system 200.

The switch controller 203 receives the mode signal MODE, a first switch enable signal $SW_{EN1}$, a second switch enable signal $SW_{EN2}$, and a third switch enable signal $SW_{EN3}$. Additionally, the switch controller 203 generates a first switch control signal $SW_{CTL1}$ for controlling the first RF switch 201a, a second switch control signal $SW_{CTL2}$ for controlling the second RF switch 201b, and a third switch control signal $SW_{CTL3}$ for controlling the third RF switch 201c. The illustrated switch controller 203 includes a level shifter control circuit 252, a first level shifter 251a, a second level shifter 251b, and a third level shifter 251c. The level shifter control circuit 252 can operate in a manner similar to that of the level shifter control circuit 52 of FIG. 4. Additionally, the level shifters 251a-251c can each operate in a manner similar to that of the level shifter 51 of FIG. 4.

Although the illustrated switch controller includes three level shifters, the switch controller can include more or fewer level shifters.

Additional details of the RF system 200 can be as described earlier.

Figure 10A:
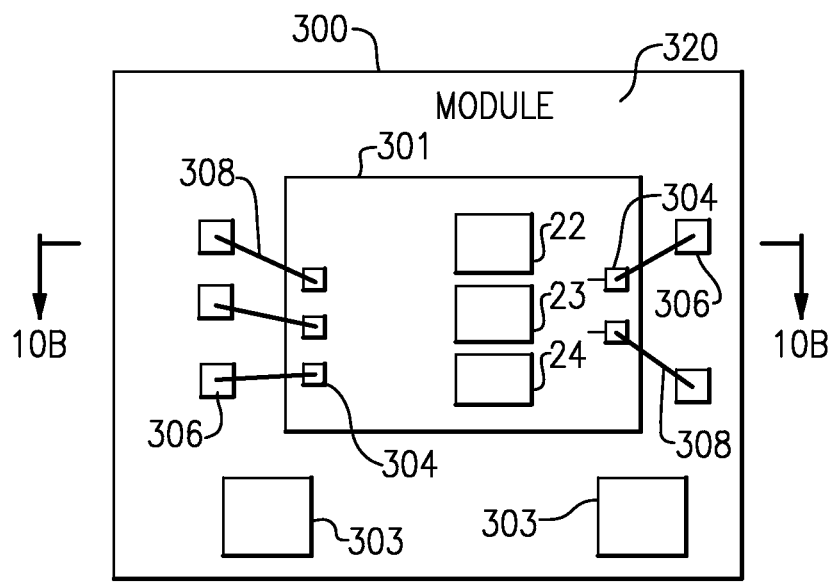
FIG. 10A is a schematic diagram of one embodiment of a packaged module.
Figure 10B:
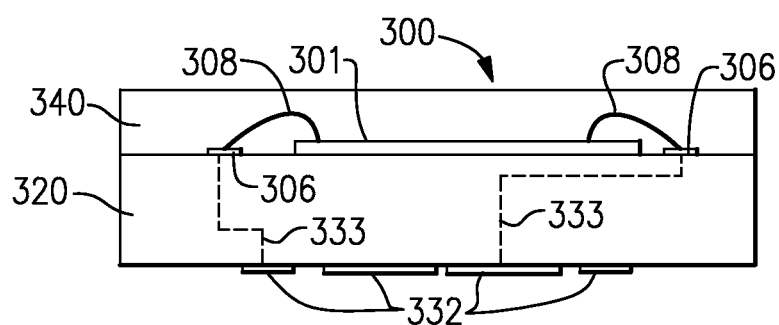
FIG. 10B is a schematic diagram of a cross-section of the packaged module of FIG. 10A taken along the lines 10B-10B.

FIG. 10A is a schematic diagram of one embodiment of a packaged module 300. FIG. 10B is a schematic diagram of a cross-section of the packaged module 300 of FIG. 10A taken along the lines 10B-10B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 10A and 10B, the die 301 includes a charge pump 22, a switch controller 23, and switches 12, which can be as described earlier.

The packaging substrate 320 can be configured to receive a plurality of components such as the die 301 and the surface mount components 303, which can include, for example, surface mount capacitors and/or inductors.

As shown in FIG. 10B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 10B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for control circuits for radio frequency switches.

Such switch controllers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency system comprising:
    a charge pump configured to generate a charge pump voltage, the charge pump further configured to receive a mode signal operable to enable the charge pump in a first state and to disable the charge pump in a second state;
    a first radio frequency switch;
    a first level shifter configured to control the first radio frequency switch based on a first switch enable signal, the first level shifter configured to receive power in part from the charge pump voltage; and
    a level shifter control circuit configured to receive the charge pump voltage and the mode signal and to bias the first level shifter with a bias voltage, the level shifter control circuit further configured to control a voltage level of the bias voltage based on a state of the mode signal, and to control the voltage level of the bias voltage to track a voltage level of the charge pump voltage when the mode signal is in the first state.

2. The radio frequency system of claim 1 wherein the level shifter control circuit is further configured to control the voltage level of the bias voltage to a DC voltage when the mode signal is in the second state.

3. The radio frequency system of claim 1 wherein the level shifter includes a plurality of n-type metal oxide semiconductor cascode transistors including gates that are biased by the bias voltage.

4. The radio frequency system of claim 3 wherein the level shifter further includes a plurality of p-type metal oxide semiconductor cascode transistors including gates that are biased by a power low supply voltage, a first p-type metal oxide semiconductor cascode transistor of the plurality of p-type metal oxide semiconductor cascode transistors and a first n-type metal oxide semiconductor cascode transistor of the plurality of n-type metal oxide semiconductor cascode transistors electrically connected in series between a power high supply voltage and the charge pump voltage.

5. The radio frequency system of claim 1 wherein the level shifter control circuit includes a cascode reference circuit configured to generate a cascode reference voltage that changes in relation to the charge pump voltage, the level shifter control circuit configured to control the voltage level of the bias voltage to the cascode reference voltage when the mode signal is in the first state.

6. The radio frequency system of claim 5 wherein the level shifter control circuit includes an n-type metal oxide semiconductor transistor and a p-type metal oxide semiconductor transistor that operate in parallel to electrically connect the cascode reference voltage to the bias voltage when the mode signal is in the first state.

7. The radio frequency system of claim 5 wherein the cascode reference circuit includes a voltage divider electrically connected between a power high supply voltage and the charge pump voltage, the voltage divider configured to generate the cascode reference voltage.

8. The radio frequency system of claim 7 wherein the voltage divider includes a plurality of diode-connected transistors electrically connected in series.

9. The radio frequency system of claim 1 wherein the level shifter control circuit includes a standby control circuit configured to control a voltage level of the charge pump voltage to a power low supply voltage when the mode signal is in the second state.

10. The radio frequency system of claim 9 wherein the standby control circuit is further configured to control a voltage level of the first switch control signal to the power low supply voltage when the mode signal is in the second state.

11. The radio frequency system of claim 1 further comprising a second radio frequency switch and a second level shifter configured to control the second radio frequency switch based on a second switch enable signal, the level shifter control circuit further configured to bias the second level shifter with the bias voltage.

12. A method of radio frequency switch control, the method comprising:
generating a charge pump voltage using a charge pump;
enabling the charge pump when a mode signal is in a first state and disabling the charge pump when the mode signal is in a second state;
powering a first level shifter in part using the charge pump voltage;
controlling a first radio frequency switch based on level shifting a first switch enable signal using a first level shifter;
biasing the first level shifter with a bias voltage from a level shifter control circuit;
providing the charge pump voltage and the mode signal to the level shifter control circuit; and
controlling a voltage level of the bias voltage using the level shifter control circuit based on a state of the mode signal, including controlling the voltage level of the bias voltage to track a voltage level of the charge pump voltage when the mode signal is in the first state.

13. The method of claim 12 wherein controlling the voltage level of the bias voltage based on the state of the mode signal further includes controlling the voltage level of the bias voltage to a DC voltage when the mode signal is in the second state.

14. The method of claim 12 wherein biasing the level shifter using the bias voltage includes biasing a plurality of transistor gates of the level shifter using the bias voltage.

15. The method of claim 12 further comprising controlling the voltage level of the charge pump voltage to a power low supply voltage when the mode signal is in the second state.

16. The method of claim 12 further comprising powering a second level shifter in part using the charge pump voltage, controlling a second radio frequency switch based on level shifting a second switch enable signal using a second level shifter, and biasing the second level shifter with the bias voltage.

17. A power amplifier system comprising:
a charge pump configured to generate a charge pump voltage, the charge pump further configured to receive a mode signal operable to enable the charge pump in a first state and to disable the charge pump in a second state;
a power amplifier configured to generate an amplified radio frequency signal;
an antenna;
a radio frequency switch electrically connected between an output of the power amplifier and the antenna; and
a switch controller including a level shifter configured to control the radio frequency switch based on a switch enable signal, the level shifter configured to receive power in part from the charge pump voltage, the switch controller further including a level shifter control circuit configured to receive the charge pump voltage and the mode signal and to bias the level shifter with a bias voltage, the level shifter control circuit further configured to control a voltage level of the bias voltage based on a state of the mode signal, and to control the voltage level of the bias voltage to track a voltage level of the charge pump voltage when the mode signal is in the first state.

18. The power amplifier system of claim 17 wherein the level shifter control circuit is further configured to control the voltage level of the bias voltage to a DC voltage when the mode signal is in the second state.

19. The power amplifier system of claim 17 wherein the level shifter includes a plurality of n-type metal oxide semiconductor cascode transistors including gates that are biased by the bias voltage.

20. The power amplifier system of claim 17 wherein the level shifter control circuit includes a cascode reference circuit configured to generate a cascode reference voltage that changes in relation to the charge pump voltage, and an n-type metal oxide semiconductor transistor and a p-type metal oxide semiconductor transistor that operate in parallel to electrically connect the cascode reference voltage to the bias voltage when the mode signal is in the first state.

* * * * *